(12) United States Patent
Gokmen

(10) Patent No.: US 12,293,281 B2
(45) Date of Patent: May 6, 2025

(54) TRAINING DNN BY UPDATING AN ARRAY USING A CHOPPER

(71) Applicant: International Business Machines Corporation, Armonk, NY (US)

(72) Inventor: Tayfun Gokmen, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1023 days.

(21) Appl. No.: 17/226,416

(22) Filed: Apr. 9, 2021

(65) Prior Publication Data

US 2022/0327375 A1 Oct. 13, 2022

(51) Int. Cl.
*G06N 3/065* (2023.01)
*G06F 11/14* (2006.01)
(Continued)

(52) U.S. Cl.
CPC ... *G06N 3/065* (2023.01); *G05B 2219/21008* (2013.01); *G05B 2219/25255* (2013.01); *G05B 2219/32335* (2013.01); *G05B 2219/33027* (2013.01); *G05B 2219/33033* (2013.01); *G05B 2219/33186* (2013.01);
(Continued)

(58) Field of Classification Search
CPC .......... G06N 3/065; G06N 3/08; G06N 3/048; G06N 3/084; G06F 17/16; G05B 2219/21008; G05B 2219/25255; G05B 2219/32335; G05B 2219/33027; G05B 2219/33033; G05B 2219/33186; G05B 2219/41397; G11C 5/063
See application file for complete search history.

(56) References Cited

U.S. PATENT DOCUMENTS 5,459,817 A 10/1995 Shima
7,398,259 B2 7/2008 Nugent
(Continued)

FOREIGN PATENT DOCUMENTS

WO WO-2022109593 A1 * 5/2022 ............. G06N 3/044

OTHER PUBLICATIONS

Fouda et al., "Error-Triggered Learning of Multi-layer Memristive Spiking Neural Networks" Nov. 20, 2020, U.S. Appl. No. 63/116,271. (Year: 2020).*

(Continued)

*Primary Examiner* — Miranda M Huang
*Assistant Examiner* — Chase P. Hinckley
(74) *Attorney, Agent, or Firm* — Gavin Giraud

(57) ABSTRACT

Embodiments disclosed herein include a method of training a DNN. A processor initializes an element of an A matrix. The element may include a resistive processing unit. A processor determines incremental weight updates by updating the element with activation values and error values from a weight matrix multiplied by a chopper value. A processor reads an update voltage from the element. A processor determines a chopper product by multiplying the update voltage by the chopper value. A processor directs storage of an element of a hidden matrix. The element of the hidden matrix may include a summation of continuous iterations of the chopper product. A processor updates a corresponding element of a weight matrix based on the element of the hidden matrix reaching a threshold state.

21 Claims, 12 Drawing Sheets

(51) Int. Cl.
*G06F 17/16* (2006.01)
*G06N 3/08* (2023.01)
*G11C 5/06* (2006.01)

(52) U.S. Cl.
CPC ............ *G05B 2219/41397* (2013.01); *G06F 11/1476* (2013.01); *G06F 17/16* (2013.01); *G06N 3/08* (2013.01); *G11C 5/063* (2013.01)

(56) References Cited

U.S. PATENT DOCUMENTS

| | | | |
|---|---|---|---|
| 9,639,719 B2* | 5/2017 | Kouwenhoven | H02M 7/217 |
| 10,423,861 B2 | 9/2019 | Gao et al. | |
| 10,460,237 B2 | 10/2019 | Kara et al. | |
| 10,755,170 B2 | 8/2020 | Gokmen et al. | |
| 11,126,403 B2* | 9/2021 | Yang | H04L 9/0662 |
| 11,275,124 B2* | 3/2022 | Umezawa | G01R 31/40 |
| 2015/0170025 A1* | 6/2015 | Wu | G06N 3/065 |
| | | | 706/25 |
| 2016/0004887 A1* | 1/2016 | Kouwenhoven | G01R 19/02 |
| | | | 327/349 |
| 2018/0075338 A1* | 3/2018 | Gokmen | G06N 3/045 |
| 2019/0130954 A1* | 5/2019 | Camsari | G11C 11/161 |
| 2019/0138896 A1 | 5/2019 | Deng | |
| 2019/0318239 A1* | 10/2019 | Kim | G06N 3/08 |
| 2020/0066340 A1* | 2/2020 | Sharma | H10N 70/046 |
| 2020/0110909 A1* | 4/2020 | Ge | G11C 11/1675 |
| 2020/0160186 A1* | 5/2020 | Lesso | G06N 3/08 |
| 2020/0311535 A1* | 10/2020 | Shrivastava | G06V 10/82 |
| 2020/0334523 A1* | 10/2020 | Kumar | G11C 11/54 |
| 2020/0411091 A1* | 12/2020 | Hwang | G06N 3/065 |
| 2021/0150317 A1* | 5/2021 | Hou | G11C 13/004 |
| 2021/0158869 A1* | 5/2021 | Yano | G11C 13/004 |
| 2021/0174182 A1* | 6/2021 | Greenberg | G11C 11/54 |
| 2021/0192325 A1* | 6/2021 | Hoang | G11C 13/0069 |
| 2021/0217469 A1* | 7/2021 | Min | G11C 13/0069 |
| 2022/0027723 A1* | 1/2022 | Kolter | G06N 3/08 |
| 2022/0028444 A1* | 1/2022 | Papageorgiou | G06N 3/08 |
| 2022/0165311 A1* | 5/2022 | Kimura | G11C 11/419 |
| 2022/0180158 A1* | 6/2022 | Whatmough | G06F 17/15 |
| 2022/0207338 A1* | 6/2022 | Li | G06N 3/063 |
| 2022/0247425 A1* | 8/2022 | Kraemer | H03M 1/38 |
| 2022/0335278 A1* | 10/2022 | Wu | G06F 9/30036 |
| 2022/0383001 A1* | 12/2022 | Kraemer | G06J 1/00 |
| 2023/0013459 A1* | 1/2023 | Michel | H03F 3/45071 |
| 2024/0005162 A1* | 1/2024 | Fouda | G06N 3/045 |
| 2024/0312516 A1* | 9/2024 | Kim | G11C 13/0026 |

OTHER PUBLICATIONS

Gokmen et Haensch, "Algorithm for Training Neural Networks on Resistive Device Arrays" Feb. 26, 2020, pp. 1-16. (Year: 2020).*
Roy et al., "TxSim: Modeling Training of Deep Neural Networks on Resistive Crossbar Systems" Jan. 8, 2021, arXiv: 2002.11151v3, pp. 1-9. (Year: 2021).*
Crafton et al., "Merged Logic and Memory Fabrics for Accelerating Machine Learning Workloads" Mar. 10, 2021, pp. 39-68. (Year: 2021).*
Jain et al., "RxNN: A Framework for Evaluating Deep Neural Networks on Resistive Crossbars" Jan. 20, 2021, pp. 326-338. (Year: 2021).*
Bhattacharjee et al., "NEAT: Non-linearity Aware Training for Accurate and Energy-Efficient Implementation of Neural Networks on 1T-1R Memristive Crossbars" Dec. 1, 2020, arXiv: 2012.00261v1, pp. 1-7. (Year: 2020).*
Chakraborty et al., "GENIEx: A Generalized Approach to Emulating Non-Ideality in Memristive Xbars using Neural Networks" Mar. 15, 2020, arXiv: 2003.06902v1, pp. 1-7. (Year: 2020).*
Liu et al., "AIDX: Adaptive Inference Scheme to Mitigate State-Drift in Memristive VMM Accelerators" Sep. 1, 2020, arXiv: 2009.00180v1, pp. 1-5. (Year: 2020).*
Hong et al., "Selecting the No. of components in PCA via random signflips" Dec. 5, 2020, arXiv: 2012.02985v1, pp. 1-46. (Year: 2020).*
Bennett et al., "Plasticity-Enhanced Domain-Wall MTJ Neural Networks for Energy-Efficient Online Learning" Mar. 4, 2020, arXiv: 2003.02357v1, pp. 1-5. (Year: 2020).*
Mondal et al., "In-situ Stochastic Training of MTJ Crossbar based Neural Networks" Jun. 24, 2018, arXiv: 1806.09057v1, pp. 1-6. (Year: 2018).*
Ferdaus et al., "True Random No. Generation using Latency Variations of Commercial MRAM Chips" Apr. 1, 2021, arXiv: 2104.00198v1, pp. 1-6. (Year: 2021).*
Hadiashar et Dawson, "A Chopper Stabilized CMOS Analog Multiplier with Ultra Low DC Offsets" 2006, pp. 364-367. (Year: 2006).*
Godoy et al., "Chopper Stabilization of Analog Multipliers, Variable Gain Amplifiers, and Mixers" Oct. 2008, pp. 2311-2321. (Year: 2008).*
"Patent Cooperation Treaty PCT Notification of Transmittal of the International Search Report and the Written Opinion of the International Searching Authority, or the Declaration", Applicant's or agent's file reference P202006944, International application No. PCT/EP2022/057494, International filing date Mar. 22, 2022 (Mar. 22, 2022), Date of mailing Aug. 16, 2022 (Aug. 16, 2022), 12 pages.

* cited by examiner

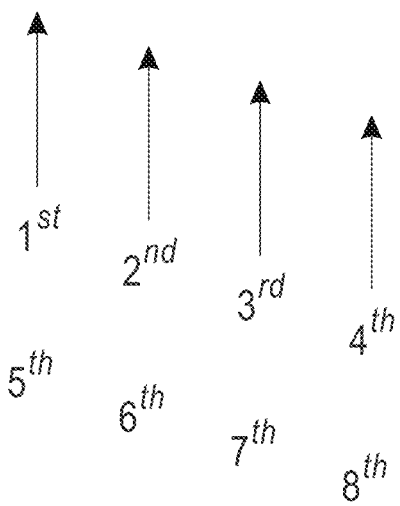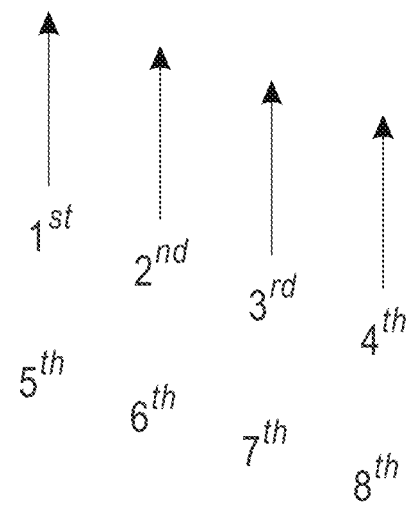
FIG. 11                    FIG. 12

TRAINING DNN BY UPDATING AN ARRAY USING A CHOPPER

BACKGROUND

The present invention relates generally to deep neural network (DNN) training, and more particularly, to techniques for adding a chopper value to filtering signals of resistive processing unit (RPU) devices to reduce noise.

A deep neural network (DNN) can be embodied in an analog cross-point array of resistive devices such as the resistive processing units (RPUs). RPU devices generally include a first terminal, a second terminal and an active region. A conductance state of the active region identifies a weight value of the RPU, which can be updated/adjusted by application of a signal to the first/second terminals.

DNN based models have been used for a variety of different cognitive based tasks such as object and speech recognition and natural language processing. DNN training is needed to provide a high level of accuracy when performing such tasks. Training large DNNs is a computationally intensive task. Most popular methods of DNN training, such as backpropagation and stochastic gradient descent (SGD), require the RPUs to be "symmetric" to work accurately. Symmetric analog resistive devices change conductance symmetrically when subjected to positive and negative voltage pulses. In practice, however, RPU devices can exhibit non-linear and non-symmetric switching characteristics. For instance, when voltage pulses are applied to adjust the weight up or down, there is often an imbalance between up and down adjustments.

SUMMARY

The present invention provides techniques for training a deep neural network (DNN) that uses resistive processing units (RPU) to track and update weight values. The techniques described herein overcome a problem with noise and bias that may be introduced by the RPUs. Specifically, noise introduced by the RPUs is addressed by using a hidden matrix acting like a low pass filter, while the bias is addressed using a chopper.

In an embodiment of a method or computer program product, a processor determines incremental weight updates by updating elements of an A matrix with activation values and error values from a weight matrix multiplied by a chopper value. The element may include a resistive processing unit. A processor reads an update voltage from the element. A processor determines a chopper product by multiplying the update voltage by the chopper value. A processor stores an element of a hidden matrix. The element of the hidden matrix may include a summation of continuous iterations of the chopper product. A processor updates a corresponding element of a weight matrix based on the element of the hidden matrix reaching a threshold state.

In an embodiment, a processor tracks summations of chopper products for elements of an A matrix in corresponding elements of a hidden matrix. The chopper products may include activation and error values from a corresponding element of a weight matrix multiplied by a chopper value before and after being applied to the A matrix. A processor triggers an update for the corresponding element of the weight matrix when the summation of one of the summations reaches a threshold.

An embodiment may include a deep neural network (DNN) having an A matrix with resistive processing unit (RPU) devices separating intersections between conductive row wires and conductive column wires. The RPU devices may include processed gradients for weighted connections between neurons in the DNN. The DNN may include a weight matrix with RPU devices separating intersections between conductive row wires and conductive column wires. The RPU devices may include weighted connections between neurons in the DNN. The DNN may include a chopper configured to multiply activation values and error values from the weight matrix by a chopper value before being applied to the A matrix, and multiply an output vector from the A matrix by the chopper value to produce a chopper product. The DNN may include a computer storage configured to store a hidden matrix including an H value for each RPU device in the weight matrix W. The H value may include a summation of the chopper product.

In an embodiment, training a deep neural network (DNN) may include transmitting an input vector $e_i$ multiplied by a chopper value as voltage pulses through conductive column wires of an A matrix and reading a resulting output vector y' as current output from conductive row wires of the A matrix. The A matrix may include resistive processing unit (RPU) devices separating intersections between the conductive column wires and the conductive row wires. The training may include determining a chopper product for each RPU by multiplying the output vector y' by the chopper value. The training may include updating H values of a hidden matrix by iteratively adding the chopper product, wherein the hidden matrix comprises an H value for each RPU. The training may include, after an H value reaches a threshold value, transmitting the input vector $e_i$ as a voltage pulse through the conductive column wires of a weight matrix W simultaneously with sign information of the H values that reached a threshold value as voltage pulses through the conductive row wires of the weight matrix W.

A more complete understanding of the present invention, as well as further features and advantages of the present invention, will be obtained by reference to the following detailed description and drawings.

BRIEF DESCRIPTION OF THE DRAWINGS

FIG. 11 is a diagram illustrating an exemplary one hot encoded vector according to an embodiment of the present invention;

FIG. 12 is a diagram illustrating an exemplary Hadamard matrix of order 2 according to an embodiment of the present invention;

DETAILED DESCRIPTION

Provided herein are deep neural network (DNN) training techniques with asymmetric resistive processing unit (RPU) devices. The DNN is trained by adjusting weight values between layers of perceptrons until data inputs running through the DNN accurately match data outputs for a set of training data that is fed into the DNN. These weight values may be stored digitally, but in the embodiments disclosed herein, the weight values are stored in RPU devices embodied in a weight matrix. The use of RPU devices improve the speed and reduce resource consumption of the DNN, but may introduce noise and bias that are inherent to many analog systems. To mitigate the noise and bias of the analog RPU devices, the embodiments disclosed herein include a hidden matrix that acts like a low-pass filter to mitigate noise, and a chopper that introduces a positive or negative chopper value that mitigates bias.

Figure 1A:
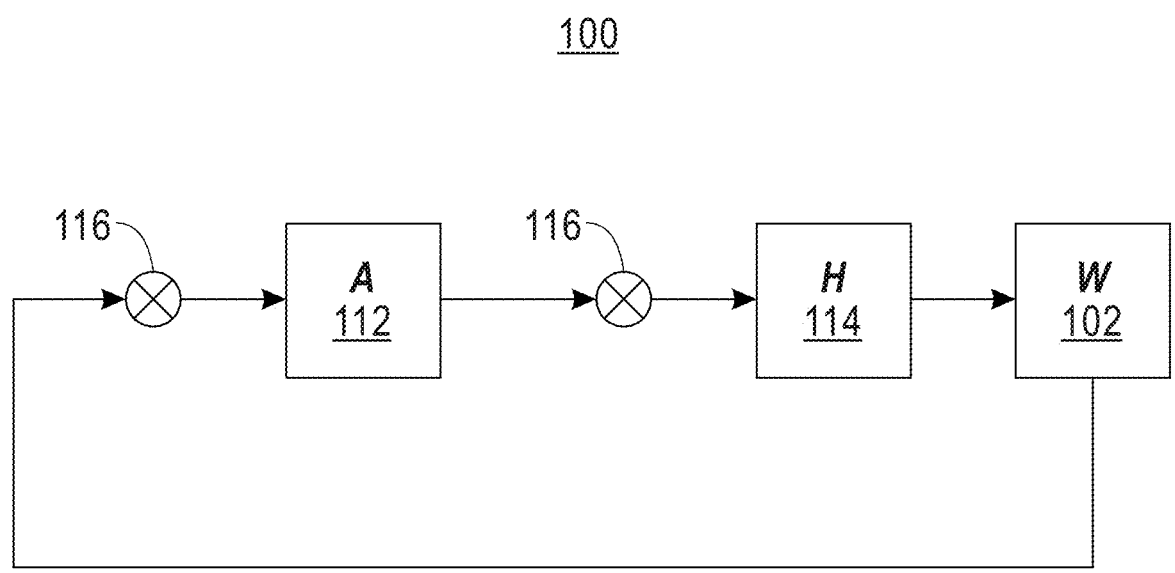
FIG. 1A is a schematic diagram illustrating a deep neural network (DNN) having a weight matrix W, an A matrix, and a hidden matrix H.

Turning now to the figures, FIG. 1A is a schematic diagram illustrating a deep neural network (DNN) 100 having a weight matrix W 102, an A matrix 112, and a hidden matrix H 114. The weight matrix W 102 is iteratively trained using the A matrix 112 and the hidden matrix 114, as indicated by the arrow direction shown in FIG. 1A. As highlighted above, the weight matrix W 102 can be embodied in an analog cross-point array of RPUs. See, for example, the schematic diagram shown in FIG. 1B.

Figure 1B:
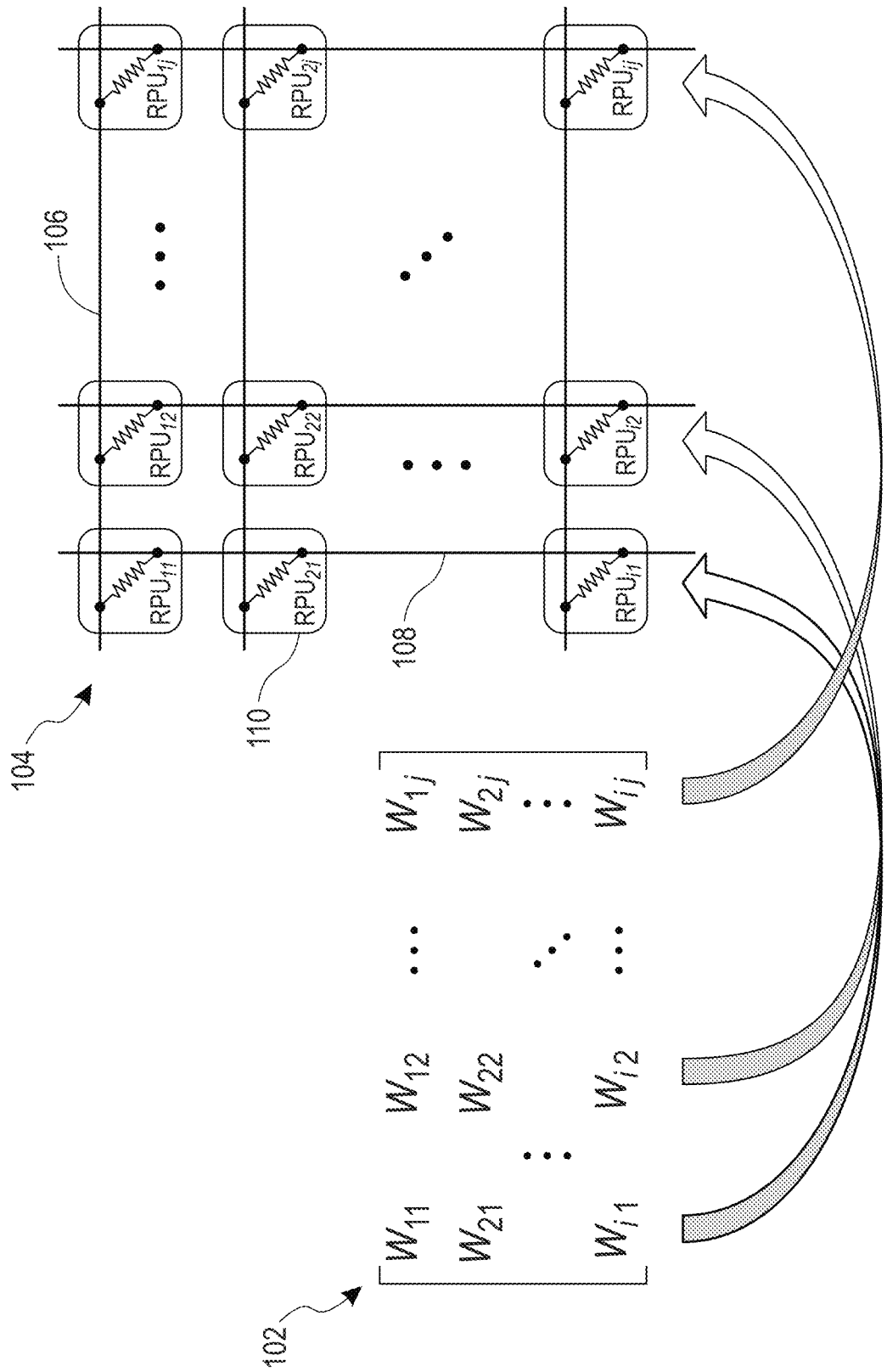
FIG. 1B is a diagram illustrating a deep neural network (DNN) embodied in an analog cross-point array of resistive processing unit (RPU) devices according to an embodiment of the present invention.

As shown in FIG. 1B, each parameter (weight $w_{ij}$) of algorithmic (abstract) weight matrix 102 is mapped to a single RPU device ($RPU_{ij}$) on hardware, namely a physical cross-point array 104 of RPU devices. Cross-point array 104 includes a series of conductive row wires 106 and a series of conductive column wires 108 oriented orthogonal to, and intersecting, the conductive row wires 106. The intersections between the row and column wires 106 and 108 are separated by RPUs 110 forming cross-point array 104 of RPU devices. Each RPU 110 can include a first terminal, a second terminal and an active region. A conduction state of the active region identifies a weight value of the RPU 110, which can be updated/adjusted by application of a signal to the first/second terminals. Further, three-terminal (or even more terminal) devices can serve effectively as two-terminal resistive memory devices by controlling the extra terminals.

Each RPU 110 ($RPU_{ij}$) is uniquely identified based on its location in (i.e., the $i^{th}$ row and $j^{th}$ column) of the cross-point array 104. For instance, working from the top to bottom, and from the left to right of the cross-point array 104, the RPU at the intersection of the first row wire 106 and the first column wire 108 is designated as $RPU_{11}$, the RPU at the intersection of the first row wire 106 and the second column wire 108 is designated as $RPU_{12}$, and so on. Further, the mapping of the parameters of weight matrix 102 to the RPUs of the cross-point array 104 follows the same convention. For instance, weight $w_{i1}$ of weight matrix 102 is mapped to $RPU_{i1}$ of the cross-point array 104, weight $w_{i2}$ of weight matrix 102 is mapped to $RPU_{i2}$ of the cross-point array 104, and so on.

The RPUs 110 of the cross-point array 104, in effect, function as the weighted connections between neurons in the DNN. The conduction state (e.g., resistance) of the RPUs 110 can be altered by controlling the voltages applied between the individual wires of the row and column wires 106 and 108, respectively. Data is stored by alteration of the RPU's conduction state. The conduction state of the RPUs 110 is read by applying a voltage and measuring the current that passes through the target RPU 110. All of the operations involving weights are performed fully in parallel by the RPUs 110.

In machine learning and cognitive science, DNN based models are a family of statistical learning models inspired by the biological neural networks of animals, and in particular the brain. These models may be used to estimate or approximate systems and cognitive functions that depend on many inputs and weights of the connections which are generally unknown. DNNs are often embodied as so-called "neuromorphic" systems of interconnected processor elements that act as simulated "neurons" that exchange "messages" between each other in the form of electronic signals. The connections in DNNs that carry electronic messages between simulated neurons are provided with numeric weights that correspond to the strength or weakness of a given connection. These numeric weights can be adjusted and tuned based on experience, making DNNs adaptive to inputs and capable of learning. For example, a DNN for handwriting recognition is defined by a set of input neurons which may be activated by the pixels of an input image. After being weighted and transformed by a function determined by the network's designer, the activations of these input neurons are then passed to other downstream neurons. This process is repeated until an output neuron is activated. The activated output neuron determines which character was read.

The DNN 100 illustrated in FIG. 1A is trained by updating the weight values $W_{ij}$ through the A matrix 112 and then summing the resulting output from the A matrix 112 into the hidden matrix 114 until an element of the hidden matrix 114 (i.e., $H_{ij}$) reaches a threshold value, as explained in detail below. Before and after the weight values are updated in the A matrix 112, however, a chopper 116 multiplies the inputs and outputs signals by a chopper value. The chopper value at a given time is equal to either a positive one (+1) or a negative one (−1). The chopper 116 randomly flips between the chopper values, such that for part of the training period the updates are applied to the A matrix 114 with an opposite sign. This random sign flip by the chopper 116 means that any "bias" contributed to the weight value by the A matrix 112 has one sign (i.e., positive or negative) for some periods of the training time, and the other sign (i.e., negative or positive) for other periods of the training time. Bias can be inherent in any analog system, including non-ideal RPUs that may be used in the DNN 100.

Figure 2A:
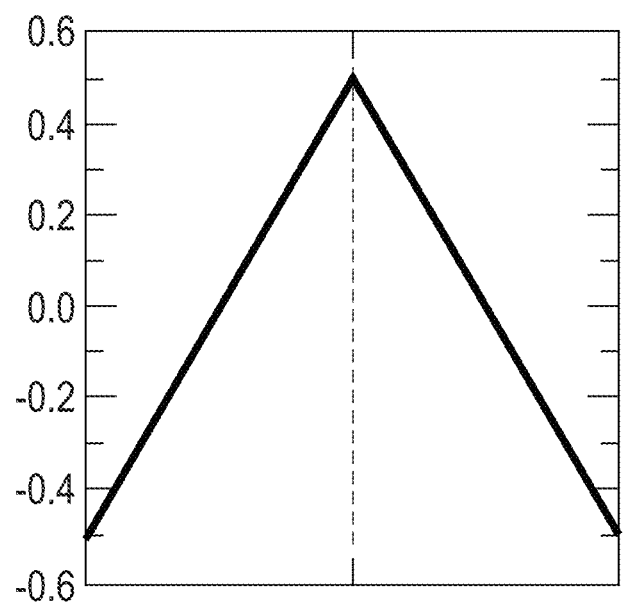
FIG. 2A is a diagram illustrating ideal switching characteristics of an RPU device that are linear and symmetric according to an embodiment of the present invention.

FIG. 2A is a diagram illustrating ideal switching characteristics of an RPU device that are linear and symmetric according to an embodiment of the present invention. As shown in FIG. 2A, the ideal RPU responds linearly and symmetrically to an external voltage stimuli. For training purposes, such an ideal device perfectly implements the DNN training process of backpropagation and stochastic gradient descent (SGD). Backpropagation is a training process performed in three cycles: a forward cycle, a backward cycle, and a weight update cycle which are repeated multiple times until a convergence criterion is met. Stochastic gradient decent (SGD) uses the backpropagation to calculate the error gradient of each parameter (weight wij).

To perform backpropagation, DNN based models are composed of multiple processing layers that learn representations of data with multiple levels of abstraction. For a single processing layer where N input neurons are connected to M output neurons, the forward cycle involves computing a vector-matrix multiplication (y=Wx) where the vector x of length N represents the activities of the input neurons, and the matrix W of size M×N stores the weight values between each pair of the input and output neurons. The resulting vector y of length M is further processed by performing a non-linear activation on each of the resistive memory elements and then passed to the next layer.

Once the information reaches to the final output layer, the backward cycle involves calculating the error signal and backpropagating the error signal through the DNN. The backward cycle on a single layer also involves a vector-matrix multiplication on the transpose (interchanging each row and corresponding column) of the weight matrix ($z=W^T\delta$), where the vector $\delta$ of length M represents the error calculated by the output neurons and the vector z of length N is further processed using the derivative of neuron non-linearity and then passed down to the previous layers.

Lastly, in the weight update cycle, the weight matrix W is updated by performing an outer product of the two vectors that are used in the forward and the backward cycles. This outer product of the two vectors is often expressed as W W+r,($\delta x^T$), where $\eta$ is a global learning rate.

All of the operations performed on the weight matrix W during this backpropagation process can be implemented with the cross-point array 104 of RPUs 110 having a corresponding number of M rows and N columns, where the stored conductance values in the cross-point array 104 form the matrix W. In the forward cycle, input vector x is transmitted as voltage pulses through each of the column wires 108, and the resulting vector y is read as the current output from the row wires 106. Similarly, when voltage pulses are supplied from the row wires 106 as input to the backward cycle, then a vector-matrix product is computed on the transpose of the weight matrix $W^T$. Finally, in the update cycle voltage pulses representing vectors x and $\delta$ are simultaneously supplied from the column wires 108 and the row wires 106. In this configuration, each RPU 110 performs a local multiplication and summation operation by processing the voltage pulses coming from the corresponding column wire 108 and row wire 106, thus achieving an incremental weight update.

As highlighted above, a symmetric RPU (see FIG. 2A) implements backpropagation and SGD perfectly. Namely, with such ideal RPUs $w_{ij}$ $w_{ij}$+r, $w_{ij}$, where $w_{ij}$ is the weight value for the $i^{th}$ row and $j^{th}$ column of the cross-point array 104.

Figure 2B:
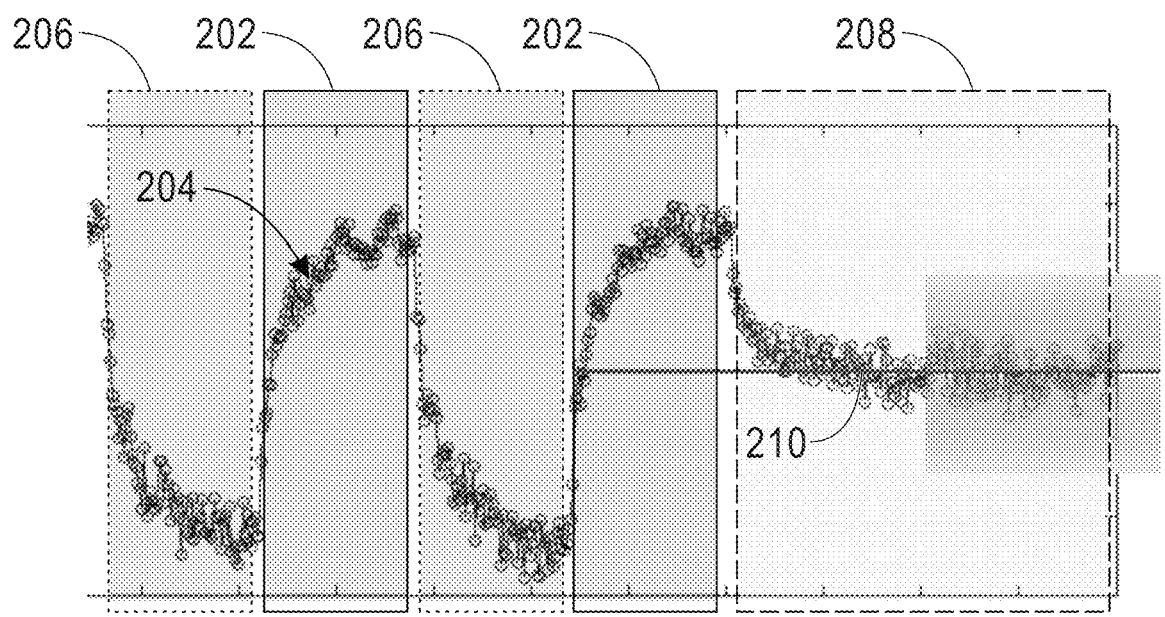
FIG. 2B is a diagram illustrating non-ideal switching characteristics of an RPU device that are non-linear and non-symmetric according to an embodiment of the present invention.

By contrast, FIG. 2B is a diagram illustrating non-ideal switching characteristics of an RPU device that are non-linear and non-symmetric according to an embodiment of the present invention. As shown in FIG. 2B, real RPUs can respond non-linearly and non-symmetrically to external voltage stimuli. Namely, during an "up" time period 202, when the RPU is given "up" pulses, a weight value 204 changes with a step size that is greater when the weight value is low. That is, the weight value 204 levels off as repeated "up" pulses are applied to the RPU. Similarly, during a "down" time period 206, when the RPU is given "down" pulses, the weight value 204 changes with a step size that is greater when the weight value is high. That is, the weight value 204 also levels off when repeated "down" pulses are applied to the RPU.

FIG. 2B also shows that an RPU has a single weight value (corresponding to the zero weight value from the zero shifting technique described in detail below) where the up and down adjustments are equal in strength but otherwise imbalanced for the rest of the weight range. During a time period 208 when a sequence of equally up and down pulses are given to the RPU device, this imbalance means that the device has a tendency to go up or down towards a symmetry point 210. This device behavior can be translated into an additional energy term (internal energy) that is originating from the RPU device's physics governing the conductance change in the RPU device. Thus, when used for backpropagation, these RPUs with non-ideal switching characteristics implement something very different from the ideal case, i.e., $w_{ij}$ $w_{ij}$+r, $w_{ij}F(w_{ij})$−r,I $w_{ij}IG(w_{ij})$, where I $w_{ij}IG(w_{ij})$ represents the additional energy term (internal energy) that shows up due to asymmetric switching characteristics of the RPU devices and $F(w_{ij})$ is the term that appears due to non-linearity in switching characteristics.

It has been found that with resistive memory devices, such as RPUs 110, there is always one single symmetry point where the slopes of the up and down pulses for each device are exactly the same. This symmetry point (which can be different for each individual RPU) can be assigned to a weight value of zero.

As shown in FIG. 2B, the symmetry point 210 for each RPU 110 in the cross-point array 104 can be determined by applying repeated (first, second, third, etc.) up and down voltage pulses to the RPUs 110 in the weight array until all of the RPUs 110 in the weight array converge to their own symmetry point. For instance, if the conductance range is from Gmin to Gmax, and average delta G at one update incident is dGavg, then the effective number of states in the conductance range is (Gmax−Gmin)/dGavg. When a device is at the extreme points and alternating up/dn pulses are given, then it will take # of updates to reach the center point=(Gmax−Gmin)/dGavg. To ensure the convergence, one can give extra cycles of alternating up/dn pulses, e.g., n×(Gmax−Gmin)/dGavg, where n=1 or larger. The up and down voltage pulses can be applied to the RPUs 110 randomly (i.e., each pulse is randomly either an up or a down pulse), in an alternating manner (i.e., if the preceding pulse is an up pulse, then the next pulse is a down pulse, and vice versa), etc.

Once all of the RPUs 110 in the weight array have all converged to their own symmetry point, the conductance values for each RPU 110 from the weight array (at the symmetry point) are copied to a separate, reference array that is interconnected with the weight array. There is a one-to-one correlation between the devices in the weight array and reference array such that a unique zero-weight value can be established in each device in the reference array for one corresponding device in the weight array. Thus, during operation, the outputs of the RPUs 110 in the weight array are shifted by the zero-weight value from the corresponding devices stored in the reference array. For instance, the same signal can be provided to both the weight array and the reference array. The output from the RPUs 110 in the weight array (e.g., $I_1$, $I_2$, $I_3$, etc.) can then be zero-shifted by subtracting those values from the output of the corresponding devices in the reference array (set to a zero-weight value) to achieve zero-shifted results. In practice, however, copying the symmetry points to the reference array may not always result in perfect representation. An imperfect copying of the symmetry point can complicate attempts to use the RPU arrays by introducing a "bias." That is, a bias is introduced to the system when the symmetry point is copied higher or lower than the actual symmetry point.

Figure 3:
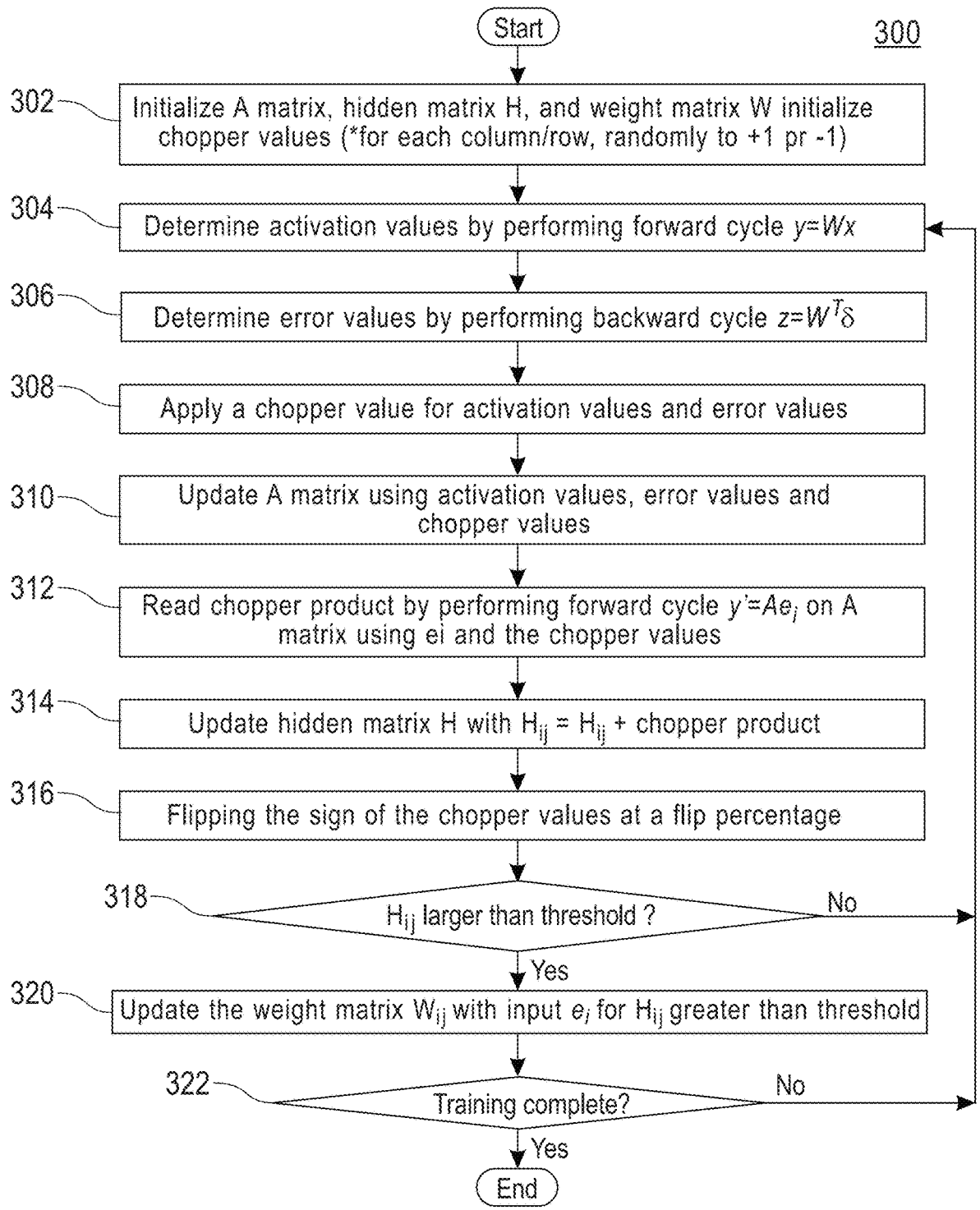
FIG. 3 is a diagram illustrating an exemplary methodology for training a DNN according to an embodiment of the present invention.

After this initial setting to achieve zero-shifted results, the present techniques are used to train the DNNs while using a chopper value to compensate for the bias that may be introduced when setting the zero-shift. FIG. 3 is a diagram illustrating an exemplary method 300 for training a DNN according to an embodiment of the present invention. During training, the weight updates are accumulated first on a A matrix. The A matrix is a hardware component made up of rows and columns of RPUs that have symmetric behavior around the zero point. The weight updates from the A matrix are then selectively moved to a weight matrix W. The weight matrix W is also a hardware component made up of rows and columns of RPUs. The training process iteratively determines a set of parameters (weights $w_{ij}$) that maximizes the accuracy of the DNN. During initialization, the reference array with the zero-weight values ensures that each RPU in a weight A matrix is at its equilibrium point for a value ideally corresponding to zero but in reality limited by imperfect copying of the symmetry point. On the other hand, the matrix W is initialized to randomly distributed values using the common practices applied for DNN training. The hidden matrix H (generally stored digitally though certain embodiments use an analog hidden matrix H) is initialized to zero.

During training, the weight updates are performed on the A matrix. Then the information processed by A matrix is accumulated in the hidden matrix H (a separate matrix effectively performing a low pass filter). The values of the hidden matrix H that reach an update threshold are then applied to the weight matrix W. The update threshold effectively minimizes noise produced within the hardware of the A matrix. For elements of the A matrix that are initialized with a bias, however, the update threshold will be reached prematurely since each iteration from the element carries a consistent update (either positive or negative) that is based on the bias, and not based on the weight updates associated with training the DNN. The chopper value negates the bias by flipping the sign of the bias for certain periods of time, during which time the bias is summed to the hidden matrix H with the opposite sign. Specifically some period of time will sum the weight value plus a positive bias to the hidden matrix H while other time periods sum the weight value plus a negative bias to the hidden matrix H. A random flipping of the chopper value means that the time periods with positive bias tend to even out with the time periods with negative bias. Therefore, the hardware bias and noise associated with non-ideal RPUs are tolerated (or absorbed by H matrix), and hence give fewer test errors compared to the standard SGD technique, a hidden matrix H alone, or other training techniques using asymmetric devices, even with a fewer number of states.

The method 300 begins by initializing the A matrix, the hidden matrix H, and the weight matrix W (block 302). Initializing the A matrix includes, for example, determining the symmetry point for each RPU in the A matrix and storing the corresponding conductance values to a reference array. As provided above, the symmetry point for each RPU device can be determined by applying repeated up and down voltage pulses (e.g., randomly, alternating, etc.) to the RPUs until all of the RPUs converge to their own symmetry point. The array A and the reference array can be embodied in two interconnected arrays and their combination forms the A matrix. Since physical conductance cannot be a negative quantity, the difference of the conductance values in array A and the reference array forms the logical value for the A matrix. However, the reference array is kept constant after the initial programming step, and we refer to A matrix and the array A in an interchangeable fashion as when A matrix is updated it is the array A that is being updated. However, for vector-matrix multiply operation performed on the A matrix always uses the differential reading of array A and the reference array. Same methodology and the operation principles also applies to the matrix W and the array W.

Figure 4:
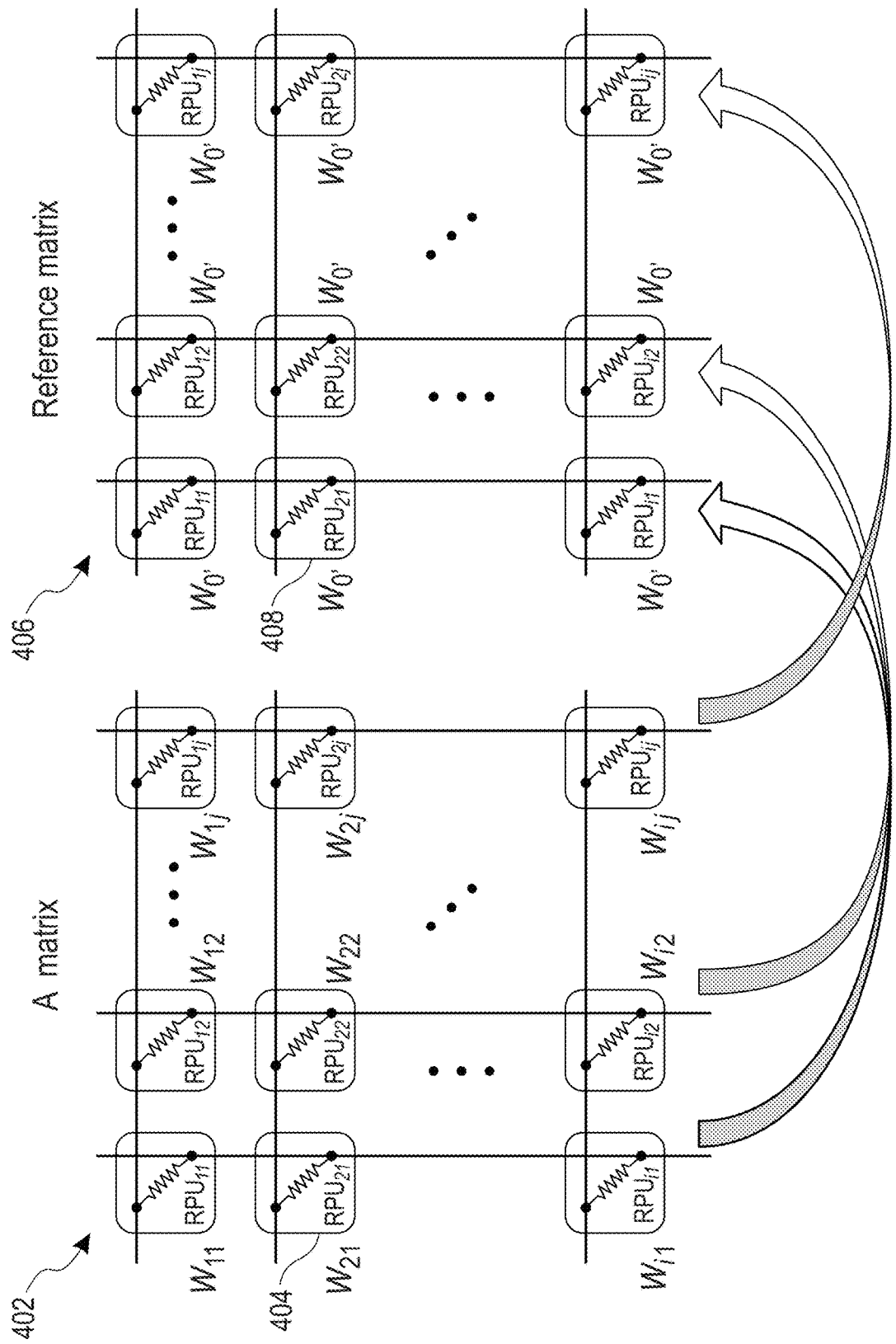
FIG. 4 is a diagram illustrating two interconnected arrays (i.e., an array W and a reference array) corresponding to a matrix W and the reference array is populated with the conductance value corresponding to the zero-weight values of the matrix W according to an embodiment of the present invention.

FIG. 4 is a diagram illustrating two interconnected arrays (i.e., a physical array and a reference array) corresponding to the A matrix and a reference array populated with the zero-weight conductance values of the A matrix according to an embodiment of the present invention. A cross-point array 402 of RPUs 404 (populated with the weight values ($w_{ij}$) of the A matrix) and a cross-point array 406 of RPUs 408 (populated with the corresponding zero-weight conductance values ($w_0'$) of the reference matrix) are shown. A unique zero-weight value ($w_0'$) can be established in each RPU in the reference matrix for one corresponding RPU in the A matrix. Initialization of the hidden matrix H includes zeroing the current values stored in the matrix, or allocating digital storage space on a connected computing device. Initialization of the weight matrix W includes loading the weight matrix W with random values so that the training process for the weight matrix W may begin.

Once the zero-weight conductance values have been stored in the reference array, training of the DNN is performed. Rather than only calculating the error gradient using backpropagation in three cycles (i.e., a forward cycle, a backward cycle, and a weight update cycle), here operations are filtered by a hidden matrix H that updates the weight value only after iterative combination of that H value grows to greater than a threshold. The iterative combination is combined with a chopper value (i.e., a random flip between either a positive one (+1) or a negative one (−1)) configured to cancel out the bias that may result from imperfect zero-shift when the symmetry point is mapped for each RPU 404. As explained above, the bias is canceled out by being multiplied with a positive bias at certain random times, and being multiplied by a negative bias at other random times.

Figure 5:
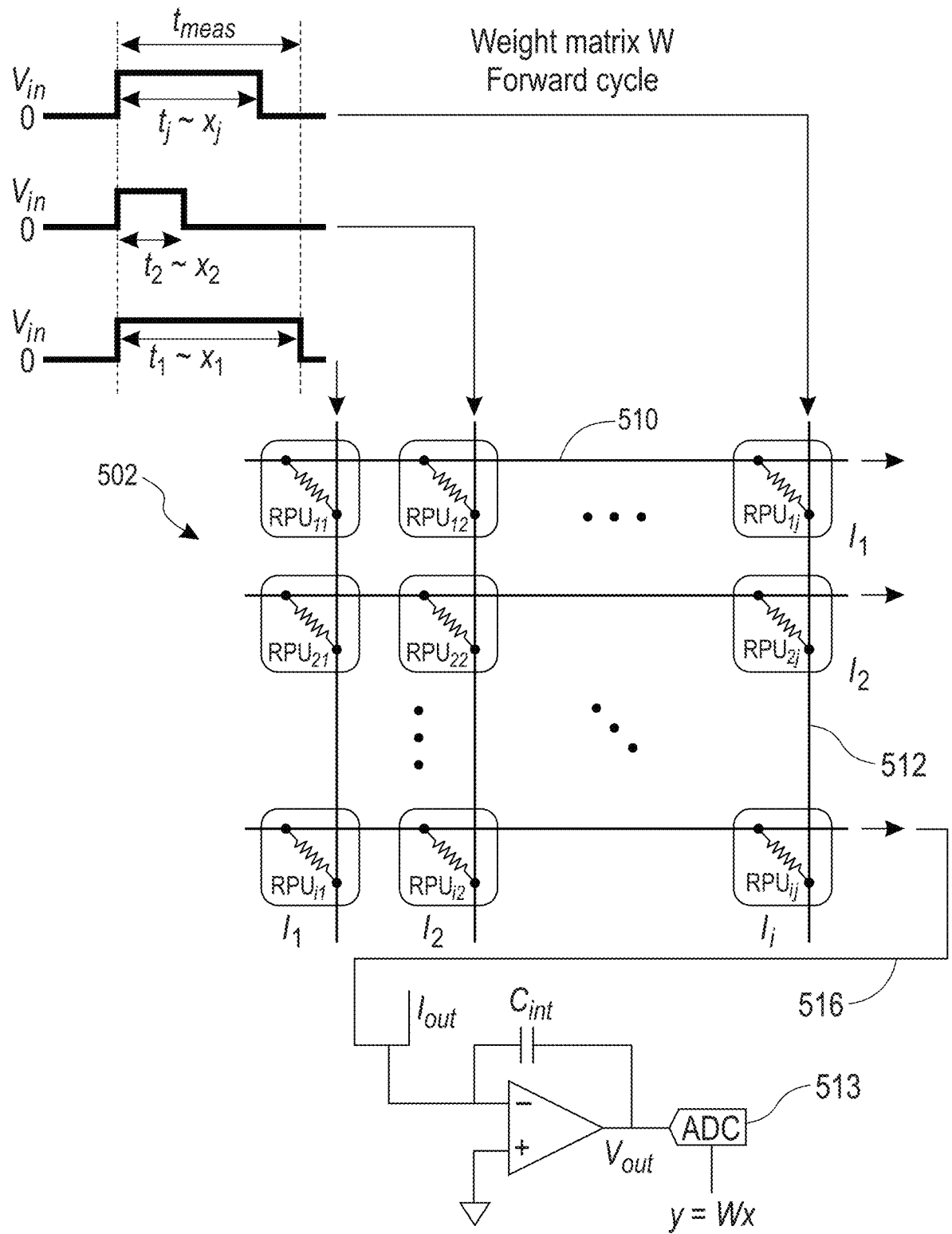
FIG. 5 is a diagram illustrating a forward cycle y=Wx being performed according to an embodiment of the present invention.

The method 300 includes determining activation values by performing a forward cycle using the weight matrix W (block 304). FIG. 5 is a diagram illustrating a forward cycle being performed according to an embodiment of the present invention. The forward cycle involves computing a vector-matrix multiplication (v=Wx) where the activation values embodied as an input vector x represents the activities of the input neurons, and the weight matrix W stores the weight values between each pair of the input and output neurons. FIG. 5 shows that the vector-matrix multiplication operations of the forward cycle are implemented in a cross-point array 502 of RPU devices, where the stored conductance values in the cross-point array 502 forms the matrix.

The input vector x is transmitted as voltage pulses through each of the conductive column wires 512, and the resulting output vector y is read as the current output from the conductive row wires 510 of cross-point array 502. An analog-to-digital converter (ADC) 513 is employed to convert the analog output vectors 516 from the cross-point array 502 to digital signals. The zero-weight conductance values copied from the reference matrix 406 are used to shift the output values of the RPU devices in cross-point array 502 relative to their symmetry point to account for bias in their switching behavior and to encode negative logical matrix values. To do so, the voltage pulses applied to the cross-point array 502 are also applied to the reference array. The output vector y of cross-point array 502 is then subtracted from that of the reference array.

Figure 6:
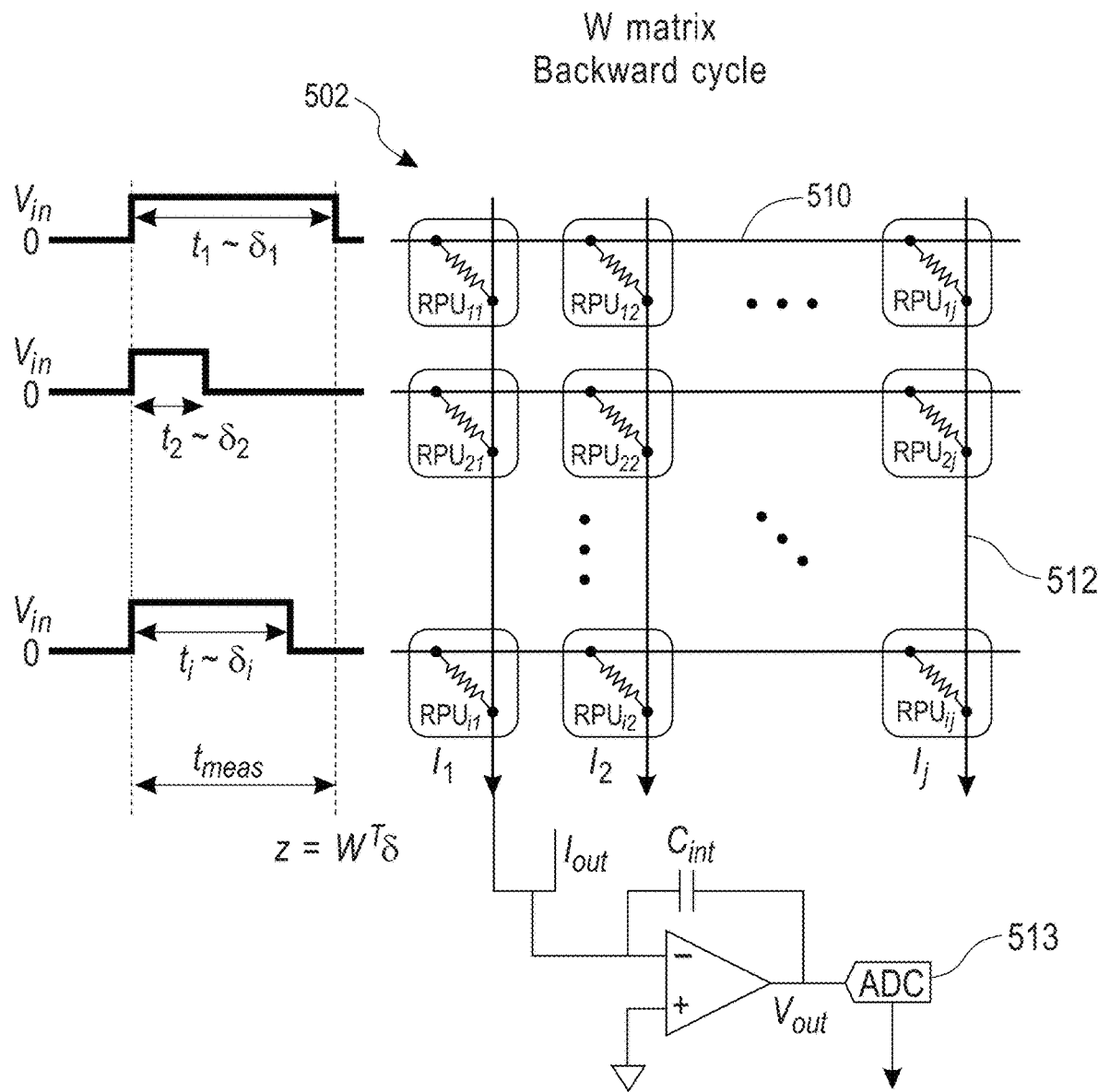
FIG. 6 is a diagram illustrating a backward cycle $z=W^T o$ being performed according to an embodiment of the present invention.

The method 300 also includes determining error values by performing a backward cycle on the weight matrix W (block 306). FIG. 6 is a diagram illustrating a backward cycle being performed according to an embodiment of the present invention. Generally, the backward cycle involves calculating the error value δ and backpropagating that error value δ through the weight matrix W via a vector-matrix multiplication on the transpose of the weight matrix W (i.e., $z=W^T\delta$), where the vector δ represents the error calculated by the output neurons and the vector z is further processed using the derivative of neuron non-linearity and then passed down to the previous layers.

FIG. 6 illustrates that the vector-matrix multiplication operations of the backward cycle are implemented in the cross-point array 502. The error value δ is transmitted as voltage pulses through each of the conductive row wires 510, and the resulting output vector z is read as the current output from the conductive column wires 512 of the cross-point array 502. When voltage pulses are supplied from the row wires 510 as input to the backward cycle, then a vector-matrix product is computed on the transpose of the weight matrix W.

As also shown in FIG. 6, the ADC 513 is employed to convert the (analog) output vectors 518 from the cross-point array 502 to digital signals. As with the forward cycle described above, the zero-weight conductance values shift the output values of the RPU devices in cross-point array 502 relative to their symmetry point to account for bias in their switching behavior and to encode negative logical matrix values. To do so, the voltage pulses applied to the cross-point array 502 are also applied to the reference array. The output vector z of the cross-point array 502 is then subtracted from that of the reference array.

Figure 7:
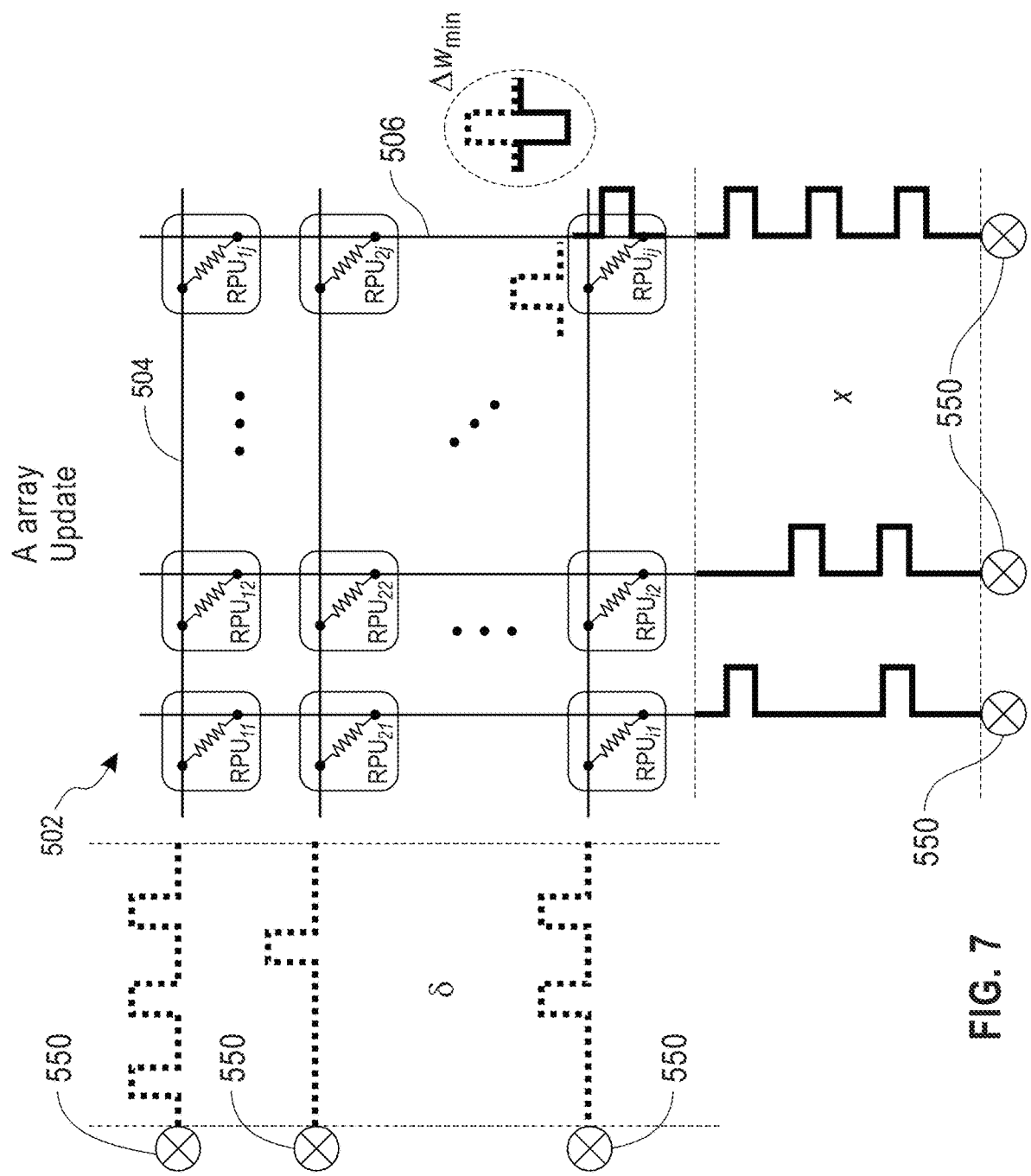
FIG. 7 is a diagram illustrating the array A being updated with x propagated in the forward cycle and δ propagated in the backward cycle according to an embodiment of the present invention.

The method 300 also includes applying a chopper value to the activation values and/or the error values (block 308). The chopper values may be applied by a chopper (e.g., chopper 116 from FIG. 1), which is included for each row wire and each column wire in the A matrix 502. In certain embodiments, the cross point array 502 may have choppers only on the column wires 506, or only on the row wires 504. After the chopper values are applied to the activation values and/or the error values, the method 300 also includes updating the A matrix with the activation values, error values, (input vectors x and δ), and chopper values (block 310). FIG. 7 is a diagram illustrating the array A 502 being updated with x propagated in the forward cycle and δ propagated in the backward cycle according to an embodiment of the present invention. Each row and column has a chopper value 550 applied to the respective wire. The sign of the chopper value 550 is represented as "+" for positive chopper value (i.e., no change to the activation value or error value) or an "X" for a negative chopper value (i.e., sign change to the activation value or error value). The updates are implemented in cross-point array 502 by transmitting voltage pulses representing vector x (from the forward cycle) and vector δ (from the backward cycle) simultaneously supplied from the conductive column wires 506 and conductive row wires 504, respectively. In this configuration, each RPU in cross-point array 502 performs a local multiplication and summation operation by processing the voltage pulses coming from the corresponding conductive column wires 506 and conductive row wires 504, thus achieving an incremental weight update. The forward cycle (block 304) the backward cycle (block 306) and updating the A matrix with the input vectors from the forward cycle and the backward cycle (block 3010) may be repeated a number of times to improve the updated values of the A matrix.

The method 300 also includes reading a chopper product by performing a forward cycle on the A matrix using an input vector $e_i$, (i.e., $y'=Ae_i$) and the chopper values (block 312). At each time step a new input vector $e_i$ is used and the sub index i denotes that time index. As will be described in detail below, according to an exemplary embodiment, input vector $e_i$ is a one hot encoded vector. For instance, as is known in the art, a one hot encoded vector is a group of bits having only those combinations having a single high (1) bit and all other bits a low (0). To use a simple, non-limiting example for illustrative purposes, assume a matrix of the size 4×4, the one hot encoded vectors will be one of the following vectors: [1 0 0 0], [0 1 0 0], [0 0 1 0] and [0 0 0 1]. At each time step a new one hot encoded vector is used and the sub index i denotes that time index. It is notable, however, that other methods are also contemplated herein for choosing input vector $e_i$. For instance, input vector $e_i$ can instead be chosen from the columns of a Hadamard matrix, a random matrix, etc.

Figure 8:
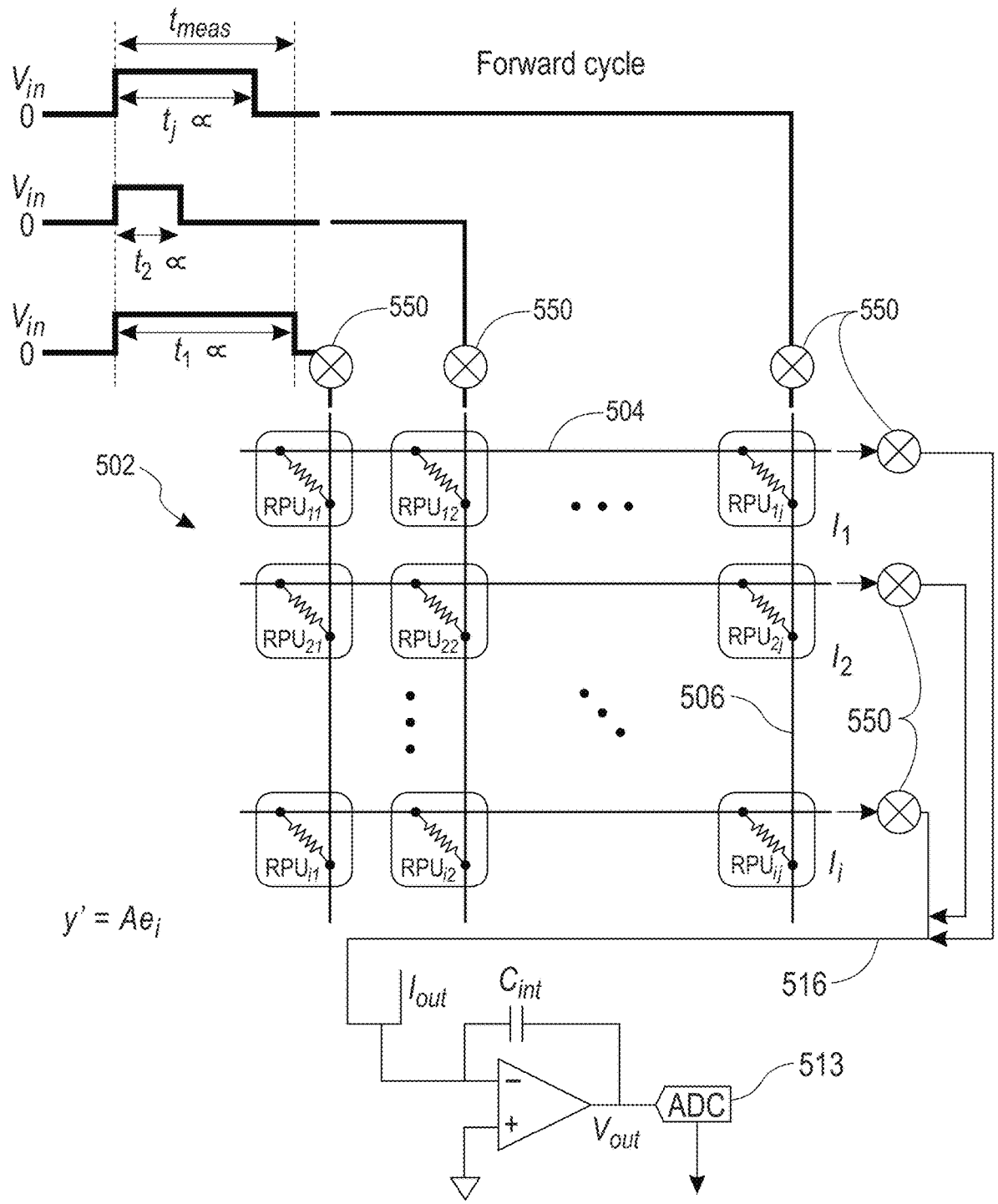
FIG. 8 is a diagram illustrating a forward cycle $y'=Ae_i$ being performed on the weight matrix according to an embodiment of the present invention.

FIG. 8 is a diagram illustrating reading a chopper product by performing a forward cycle $y'=Ae_i$ on the A matrix with chopper values according to an embodiment of the present invention. The input vector $e_i$ is transmitted as voltage pulses through each of the conductive column wires 506, and the resulting output vector y' is read as the current output from the conductive row wires 504 of cross-point array 502. Each column wire 506 and row wire 504 is read with the same chopper value (i.e., positive or negative) with which the A matrix was updated. For example, the first column wire $506_{i1}$ has a positive chopper value (+) in FIG. 7 and FIG. 8, the second column wire $506_{i2}$ has a negative chopper value (X) in FIG. 7 and FIG. 8, and the first row wire $504j$, has a negative chopper value (X) in FIG. 7 and FIG. 8. When voltage pulses are supplied from the column wires 506 as input to this forward cycle, then a vector-matrix product is computed.

Figure 9:
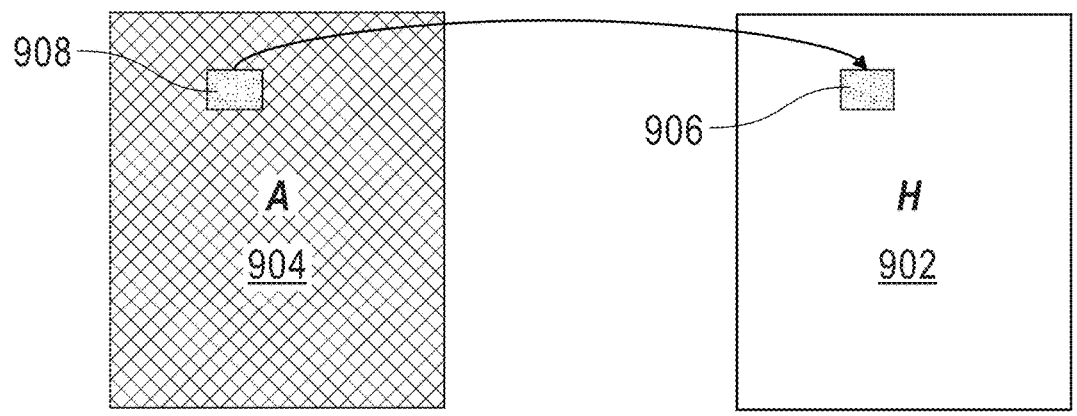
FIG. 9. is a diagram illustrating the hidden matrix H being updated with the values calculated in the forward cycle of the A matrix.

The method 300 includes updating a hidden matrix H using a chopper product (i.e., the output vector y' and the input vector $e_i$ times the chopper value) (block 314). FIG. 9 is a diagram illustrating the hidden matrix H 902 being updated with the values calculated in the forward cycle of the A matrix 904. The hidden matrix H 902 is most often a digital matrix (rather than a physical device like the A matrix and the weight matrix W) that stores an H value 906 (i.e., $H_{ij}$) for each RPU in the A matrix (i.e., each RPU located at $A_{ij}$). As the forward cycle is performed, an output vector y' $e_i^T$ is produced and multiplied by a chopper value to determine a chopper product 908, and the hidden matrix H adds the chopper product 908 to each H value 906. Thus, each time the output vector is read, the hidden matrix H 902 changes. For those RPUs with low noise levels, the H value 906 will grow consistently. The growth of the value may be in the positive or negative direction depending on the value of the output vector y' $e_i^T$. If the output vector y' $e_i^T$ includes significant noise, then it is likely to be positive for one iteration and negative for another. This combination of positive and negative output vector y' $e_i^T$ values means that the H value 906 will grow more slowly and more inconsistently.

The method 300 also includes flipping the sign of the chopper value at a flip percentage (block 316). The chopper value, in certain embodiments, is flipped only after the chopper product is added to the hidden matrix H. That is, the chopper value is used twice: once when the activation values and error values are written to the A matrix; and once when the forward cycle is read from the A matrix. The chopper value should not be flipped before the chopper product is calculated. The flip percentage may be defined as a user preference such that after each chopper product is added to the hidden matrix H, the chopper has a percentage chance of flipping the chopper value. For example, a user preference may be fifty percent, such that half of the time, the chopper value has a chance of changing the sign (i.e., positive to negative or negative to positive) after the chopper product is calculated.

Figure 10:
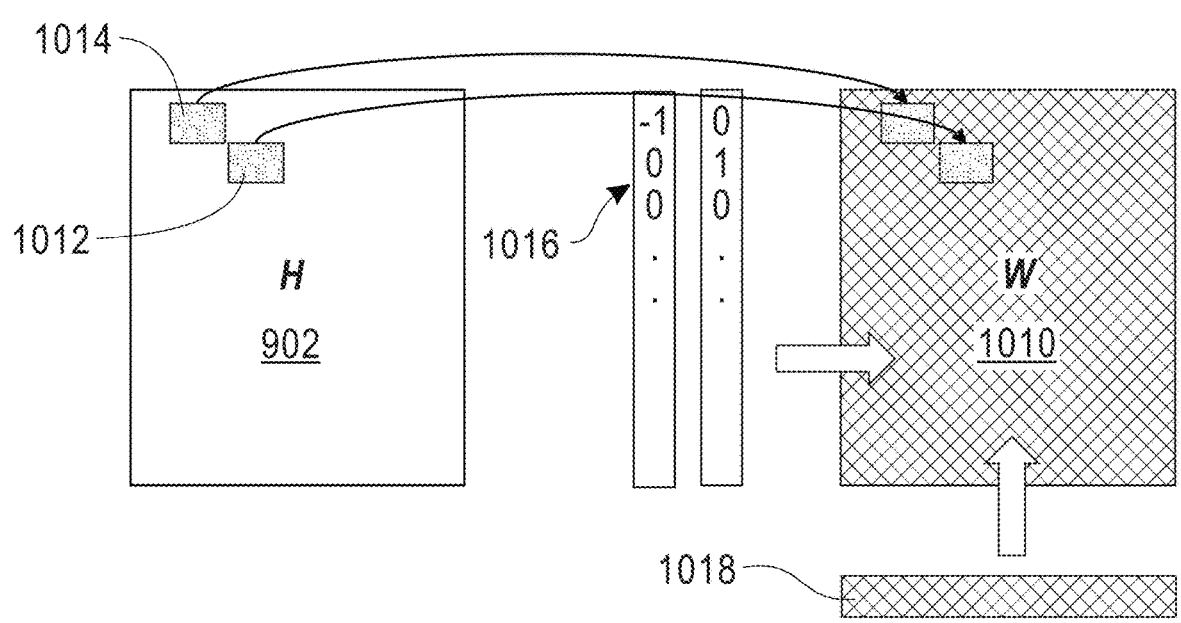
FIG. 10 is a schematic diagram of the hidden matrix H 902 being selectively applied back to the weight matrix W 1010 according to an embodiment of the present invention.

As the H values 906 grow, the method 300 includes tracking whether the H values 906 have grown larger than a threshold (block 318). If the H value 906 at a particular location (i.e., $H_{ij}$) is not larger than the threshold (block 318 "No"), then the method 300 repeats from performing the forward cycle (block 304) through updating the hidden matrix H (block 314) and potentially flipping the chopper value (block 316). If the H value 906 is larger than the threshold (block 310 "Yes"), then the method 300 proceeds to transmitting input vector $e_i$ to the weight matrix W, but only for the specific RPU (block 320). As mentioned above, the growth of the H value 906 may be in the positive or negative direction, so the threshold is also a positive or negative value. FIG. 10 is a schematic diagram of the hidden matrix H 902 being selectively applied back to the weight matrix W 1010 according to an embodiment of the present invention. FIG. 10 shows a first H value 1012, and a second H value 1014 that have reached over the threshold value and are being transmitted to the weight matrix W 1010. The first H value 1012 reached the positive threshold, and therefore carries a positive one: "1" for its row in the input vector 1016. The second H value 1014 reached the negative threshold, and therefore carries a negative one: "−1" for its row in the input vector 1016. The rest of the rows in the input vector 1016 carry zeroes, since those values (i.e., H values 906) have not grown larger than the threshold value. The threshold value may be much larger than the y' $e_i^T$ being added to the hidden matrix H. For example, the threshold may be ten times or one hundred times the expected strength of the y' $e_i^T$. These high threshold values reduce the frequency of the updates performed on weight matrix W. The filtering function performed by the H matrix, however, decreases the error of the objective function of the neural network. These updates can only be generated after processing many data examples and therefore also increase the confidence level in the updates. This technique enables training of the neural network with noisy RPU devices having only limited number of states. After the H value is applied to the weight matrix W, the H value 906 is reset to zero, and the iteration of the method 300 continues.

After the weight matrix W is updated with $e_i$, 1018, the method 300 continues by determining whether training is complete. If the training is not complete, for example a certain convergence criterion is not met (block 322 "No"), then the method 300 repeats starting again by performing the forward cycle y=Wx. For instance, by way of example only, the training can be considered complete when no more improvement to the error signal is seen. When training is completed (block 322 "Yes"), the method 300 ends.

Figure 13:
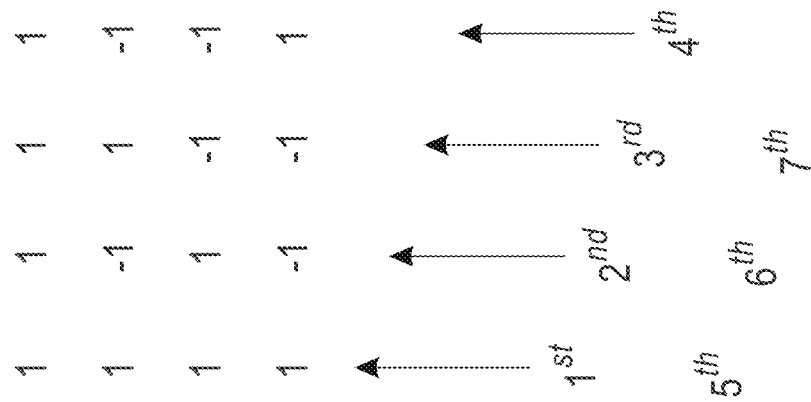
FIG. 13 is a diagram illustrating an exemplary Hadamard matrix of order 4 according to an embodiment of the present invention.

As highlighted above, according to an exemplary embodiment, the input vector $e_i$ is a one hot encoded vector which is a group of bits having only those combinations with a single high (1) bit and all other bits a low (0). See, for example, FIG. 11. As shown in FIG. 11, given a matrix of the size 4×4, the one hot encoded vectors will be one of the following vectors: [1 0 0 0], [0 1 0 0], [0 0 1 0] and [0 0 0 1]. At each time step a new one hot encoded vector is used, denoted by the sub index i at that time index. According to another exemplary embodiment, the input vector $e_i$ is chosen from the columns of a Hadamard matrix. As is known in the art, a Hadamard matrix is a square matrix with entries ±1. See, for example, FIG. 12 (a Hadamard matrix of order 2) and FIG. 13 (a Hadamard matrix of order 4). The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 14:
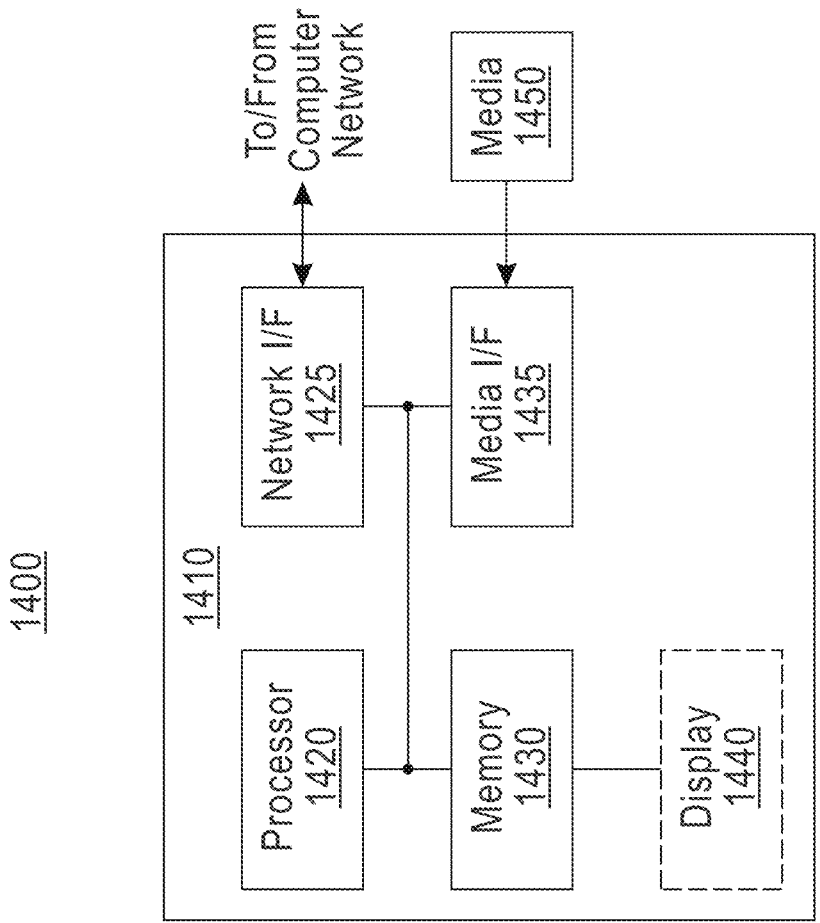
FIG. 14 is a diagram illustrating an exemplary apparatus that can be employed in carrying out one or more of the present techniques according to an embodiment of the present invention.

Turning now to FIG. 14, a block diagram is shown of an apparatus 1400 for implementing one or more of the methodologies presented herein. By way of example only, apparatus 1400 can be configured to control the input voltage pulses applied to the arrays and/or process the output signals from the arrays.

Apparatus 1400 includes a computer system 1410 and removable media 1450. Computer system 1410 includes a processor device 1420, a network interface 1425, a memory 1430, a media interface 1435 and an optional display 1440. Network interface 1425 allows computer system 1410 to connect to a network, while media interface 1435 allows computer system 1410 to interact with media, such as a hard drive or removable media 1450.

Processor device 1420 can be configured to implement the methods, steps, and functions disclosed herein. The memory 1430 could be distributed or local and the processor device 1420 could be distributed or singular. The memory 1430 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1420. With this definition, information on a network, accessible through network interface 1425, is still within memory 1430 because the processor device 1420 can retrieve the information from the network. It should be noted that each distributed processor that makes up processor device 1420 generally contains its own addressable memory space. It should also be noted that some or all of computer system 1410 can be incorporated into an application-specific or general-use integrated circuit.

Optional display 1440 is any type of display suitable for interacting with a human user of apparatus 1400. Generally, display 1440 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A computer-implemented method of training a deep neural network (DNN), the method comprising:
   determining incremental weight updates by updating an element of an A matrix with activation values and error values from a weight matrix multiplied by a chopper value comprising a random selection from the group consisting of: a positive one (+1) and a negative one (−1), wherein the element comprises an analog resistive processing unit (RPU);
reading an update voltage from the element;
determining a chopper product by multiplying the update voltage by the chopper value;
storing an element of a hidden matrix, wherein the element of the hidden matrix comprises a summation of continuous iterations of the chopper product; and
updating a corresponding element of a weight matrix based on the element of the hidden matrix reaching a threshold state, wherein the hidden matrix produces a low-pass filter to mitigate noise of the analog RPU, and the chopper value mitigates bias.

2. The method of claim 1, wherein a probability of flipping the state between the positive one value and the negative one value is user defined.

3. The method of claim 1, wherein updating the corresponding element of the weight matrix comprises transmitting a voltage pulse through conductive column wires of the A matrix simultaneously with sign information of the element of the hidden matrix as a voltage pulse through conductive row wires of the A matrix.

4. The method of claim 1, wherein the chopper value is applied to a conductive column wire of the A matrix.

5. The method of claim 1, wherein the chopper value is applied to a conductive row wire of the A matrix.

6. A computer-implemented method for training a deep neural network, comprising:
tracking summations of chopper products for elements of an A matrix in corresponding elements of a hidden matrix, wherein the chopper products comprise activation and error values from a corresponding element of the A matrix multiplied by a chopper value comprising a random selection from the group consisting of: a positive one (+1) and a negative one (−1) before being applied to the A matrix, and after being applied to the A matrix, to mitigate bias of the A matrix; and
triggering an update for the corresponding element of a weight matrix when the summation of one of the summations reaches a threshold to mitigate noise of the A matrix.

7. The method of claim 6, wherein a probability of flipping the state between the positive one value and the negative one value is user defined.

8. The method of claim 6, wherein the summations are tracked digitally.

9. A deep neural network (DNN), comprising:
an A matrix comprising analog resistive processing unit (RPU) devices separating intersections between conductive row wires and conductive column wires, whereby the RPU devices comprise processed gradients for weighted connections between neurons in the DNN;
a weight matrix comprising RPU devices separating intersections between conductive row wires and conductive column wires, whereby the RPU devices comprise weighted connections between neurons in the DNN;
a processor configured to multiply activation values and error values from the weight matrix by a chopper value before being applied to the A matrix, and multiply an output vector from the A matrix by the chopper value to produce a chopper product, wherein the chopper value comprises a random selection from the group consisting of: a positive one (+1) and a negative one (−1), and the before and after multiplication of the chopper value mitigates bias of the A matrix; and
a computer storage configured to store a hidden matrix comprising an H value for each RPU device in the weight matrix W, wherein the H value comprises a summation of the chopper product.

10. The DNN of claim 9, wherein the chopper is assigned to a selection from the group consisting of one of the column wires of the A matrix and one of the row wires of the A matrix.

11. The DNN of claim 9, wherein the chopper value flips between the positive one value and the negative one value at a user defined probability.

12. A computer program product for reducing bias in a cross-point array, the computer program product comprising:
one or more computer readable storage media, and program instructions collectively stored on the one or more computer readable storage media, the program instructions comprising:
program instructions to initialize an element of an A matrix, wherein the element comprises an analog resistive processing unit;
program instructions to determine incremental weight updates by updating the element with activation values and error values from a weight matrix multiplied by a chopper value comprising a random selection from the group consisting of: a positive one (+1) and a negative one (−1);
program instructions to read an update voltage from the element;
program instructions to determine a chopper product by multiplying the update voltage by the chopper value;
program instructions to store an element of a hidden matrix, wherein the element of the hidden matrix comprises a summation of continuous iterations of the chopper product; and
program instructions to update a corresponding element of a weight matrix based on the element of the hidden matrix reaching a threshold state, wherein the hidden matrix produces a low-pass filter to mitigate noise of the analog RPU, and the chopper value mitigates bias.

13. The computer program product of claim 12, wherein a probability of flipping the state between the positive one value and the negative one value is user defined.

14. The computer program product of claim 12, wherein updating the corresponding element of the weight matrix comprises transmitting a voltage pulse through conductive column wires of the A matrix simultaneously with sign information of the element of the hidden matrix as a voltage pulse through conductive row wires of the A matrix.

15. The computer program product of claim 12, wherein the incremental weight update comprises a matrix multiplication of an output vector and an input vector operated on the A matrix.

16. The computer program product of claim 12, wherein instructions for updating the weight matrix comprise instructions for transmitting a voltage pulse through conductive column wires of the A matrix simultaneously with sign information of the element of the hidden matrix that reached the threshold state as a voltage pulse through conductive row wires of the A matrix when the element of the hidden matrix reaches a threshold state.

17. A computer-implemented method for training a deep neural network (DNN), comprising:
- transmitting an input vector ei multiplied by a chopper value as voltage pulses through conductive column wires of an A matrix and reading a resulting output vector y' as current output from conductive row wires of the A matrix, wherein the A matrix comprises analog resistive processing unit (RPU) devices separating intersections between the conductive column wires and the conductive row wires, and wherein the chopper value comprises a random selection from the group consisting of: a positive one (+1) and a negative one (−1);
- determining a chopper product for each RPU by multiplying the output vector y' by the chopper value to mitigate bias of the A matrix;
- updating H values of a hidden matrix by iteratively adding the chopper product, wherein the hidden matrix comprises an H value for each RPU; and
- after an H value reaches a threshold value, transmitting the input vector ei as a voltage pulse through the conductive column wires of the A matrix simultaneously with sign information of the H values that reached a threshold value as voltage pulses through the conductive row wires of the A matrix.

18. The method of claim 17, wherein the input vector and the error signal comprise activation and error values from a weight matrix derived from a forward cycle and a backward cycle operated on the weight matrix.

19. The method of claim 17, wherein a probability of flipping the state between the positive one value and the negative one value is user defined.

20. The method of claim 17, wherein updating the corresponding element of the weight matrix comprises transmitting a voltage pulse through conductive column wires of the A matrix simultaneously with sign information of the element of the hidden matrix as a voltage pulse through conductive row wires of the A matrix.

21. The method of claim 17, wherein the input vector ei comprises a selection from the group consisting of a one hot encoded vector and a Hadamard matrix.

* * * * *